United States Patent
Lin et al.

(10) Patent No.: US 8,445,377 B2
(45) Date of Patent: May 21, 2013

(54) MECHANICALLY ROBUST METAL/LOW-K INTERCONNECTS

(75) Inventors: Qinghuang Lin, Yorktown Heights, NY (US); Terry A. Spooner, Clifton Park, NY (US); Darshan D. Gandhi, Troy, NY (US); Christy S. Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/229,250

(22) Filed: Sep. 9, 2011

(65) Prior Publication Data

US 2011/0318942 A1 Dec. 29, 2011

Related U.S. Application Data

(63) Continuation of application No. 11/626,550, filed on Jan. 24, 2007, now Pat. No. 8,017,522.

(51) Int. Cl.
*H01L 21/4763* (2006.01)
*H01L 21/44* (2006.01)

(52) U.S. Cl.
USPC ........... 438/624; 438/622; 438/623; 438/627; 438/675; 438/687; 257/753; 257/759; 257/760; 257/E21.54; 257/E21.241; 257/E21.261; 257/E21.277; 257/E21.576

(58) Field of Classification Search
USPC .. 438/622, 623, 624, 627, 675, 687; 257/753, 257/759, 760, E21.54, E21.241, E21.261, 257/E21.277, E21.576
See application file for complete search history.

(56) References Cited

U.S. PATENT DOCUMENTS

| | | | |
|---|---|---|---|
| 5,812,725 A | 9/1998 | Petisce | |
| 6,251,770 B1 | 6/2001 | Uglow et al. | |
| 6,472,335 B1 | 10/2002 | Tsai et al. | |
| 6,570,256 B2 | 5/2003 | Conti et al. | |
| 6,706,637 B2 * | 3/2004 | Chen et al. | 438/700 |
| 7,067,437 B2 * | 6/2006 | Edelstein et al. | 438/761 |
| 2005/0042889 A1 | 2/2005 | Lee et al. | |
| 2005/0059258 A1 | 3/2005 | Edelstein et al. | |
| 2005/0067702 A1 | 3/2005 | America et al. | |

(Continued)

OTHER PUBLICATIONS

Office Action dated Nov. 16, 2010 received in a related U.S. Appl. No. 12/538,109.

(Continued)

*Primary Examiner* — Dao H Nguyen
(74) *Attorney, Agent, or Firm* — Scully, Scott, Murphy & Presser, P.C.; Louis J. Percello, Esq.

(57) ABSTRACT

A mechanically robust semiconductor structure with improved adhesion strength between a low-k dielectric layer and a dielectric-containing substrate is provided. In particular, the present invention provides a structure that includes a dielectric-containing substrate having an upper region including a treated surface layer which is chemically and physically different from the substrate; and a low-k dielectric material located on a the treated surface layer of the substrate. The treated surface layer and the low-k dielectric material form an interface that has an adhesion strength that is greater than 60% of the cohesive strength of the weaker material on either side of the interface. The treated surface is formed by treating the surface of the substrate with at least one of actinic radiation, a plasma and e-beam radiation prior to forming of the substrate the low-k dielectric material.

20 Claims, 3 Drawing Sheets

U.S. PATENT DOCUMENTS

| | | |
|---|---|---|
| 2005/0158999 A1 | 7/2005 | Lin et al. |
| 2005/0211680 A1 | 9/2005 | Li et al. |
| 2005/0233555 A1 | 10/2005 | Rajagopalan et al. |
| 2005/0239295 A1 | 10/2005 | Wang et al. |
| 2006/0189133 A1* | 8/2006 | Dimitrakopoulos et al. .. 438/687 |
| 2007/0037388 A1 | 2/2007 | Hohage et al. |
| 2007/0105377 A1 | 5/2007 | Koos et al. |
| 2007/0138137 A1* | 6/2007 | Kim ................................ 216/63 |
| 2007/0161229 A1 | 7/2007 | Turner et al. |
| 2007/0190784 A1* | 8/2007 | Cui et al. ....................... 438/687 |
| 2007/0218214 A1* | 9/2007 | Lai et al. ........................ 427/535 |
| 2009/0042358 A1* | 2/2009 | Yoshizawa et al. ............ 438/430 |
| 2009/0053895 A1 | 2/2009 | Oshima et al. |

OTHER PUBLICATIONS

Chinese Office Action dated Feb. 5, 2010 in connection with a related foreign application.

\* cited by examiner

MECHANICALLY ROBUST METAL/LOW-K INTERCONNECTS

CROSS REFERENCE TO RELATED APPLICATION

This application is a continuation of U.S. patent application Ser. No. 11/626,550, filed Jan. 24, 2007 the entire content and disclosure of which is incorporated herein by reference. This application is also related to U.S. patent application Ser. No. 12/538,109, filed Aug. 8, 2009.

FIELD OF THE INVENTION

The present invention generally relates to a semiconductor electronic device structure comprising a low dielectric constant (i.e., low-k) dielectric having improved adhesion strength to a dielectric-containing substrate. The improved adhesion strength is achieved by treating the surface of the dielectric-containing substrate with at least one of actinic radiation, a plasma and electron beam radiation prior to the deposition of the low-k dielectric. Furthermore, the present invention relates to a method for improving the adhesion strength between different electrically conductive or dielectric layers including dielectrics that contain Si or C.

DESCRIPTION OF THE PRIOR ART

The continuous shrinking in dimensions of electronic devices utilized in ultra-large scale semiconductor integrated (ULSI) circuits in recent years has resulted in increasing the resistance of the back-end-of-the-line (BEOL) metallization without concomitantly decreasing the interconnect capacitances. Often interconnects are even scaled to higher aspect ratios (a height to width ratio of typically greater than 3:1) to mitigate the resistance increases, leading to increased capacitances. This combined effect increases signal delays in ULSI electronic devices.

In order to improve the switching performance of future ULSI circuits, low dielectric constant (k) insulators, and particularly those with a dielectric constant significantly lower than silicon oxide, are being introduced to reduce the capacitance. Silicon oxide typically has a dielectric constant of about 4.0. It is noted that unless otherwise specified the dielectric constants mentioned herein are relative to a vacuum.

The low-k materials that have been considered for applications in ULSI devices include polymers containing Si, C, O, H, such as methylsiloxane, methylsilsesquioxanes, and other organic and inorganic polymers, which are typically prepared by spin-on techniques. Alternatively, dielectric materials such as SiCH, SiOCH, carbon-doped oxides (CDO), silicon-oxycarbides, or organosilicate glasses (OSG) are deposited by plasma enhanced chemical vapor deposition (PECVD) techniques.

The incorporation of low-k dielectrics in the interconnect structures of integrated circuits (ICs) often requires the use of other dielectric materials as diffusion barrier caps, or etch-stop and hardmask layers. The adhesion among the different layers in these complex structures is often too low, resulting in delamination during the fabrication of the device, and/or in response to thermo-mechanical stresses imposed by typical chip packaging materials, and/or reliability failure during thermo-mechanical stresses.

Weak interfaces in the interconnect structures can cause the delamination during fabrication and reliability failures during thermo-mechanical stress tests. These interfaces include those of an electrically conductive metal and a dielectric cap layer, a dielectric cap layer and a low-k interlayer dielectric (ILD) layer, as well as the ILD layer and a hardmask layer.

It would thus be highly desirable to provide a semiconductor device comprising an insulating structure including a multitude of dielectric and conductive layers with good adhesion strength among the different layers, and a method for manufacturing such semiconductor devices.

U.S. Patent Application Publication No. 2005/0239295 A1 discloses a method for treating a dielectric substrate with an acidic solution to improve wettability and adhesion of subsequently deposited polymer layers. Specifically, an aqueous solution of sulfuric acid or phosphoric acid is applied to pre-treat a cured dielectric substrate. A second spin-applied pre-polymer is then deposited on the wet-treated dielectric substrate and subsequently cured.

Despite the improved wettability and adhesion, the prior art wet treatment process disclosed in the aforementioned printed publication is limited to spin-on dielectric layers, which is not the mainstay of the state-of-the-art semiconductor manufacturing. Instead, the state-of-the-art semiconductor manufacturing employs predominantly PECVD methods for the deposition of dielectric films.

U.S. Patent Application Publication No. 2005/0059258 A1 discloses a method of depositing a thin dielectric adhesion transition layer for improving interfacial strength between PECVD deposited dielectric layers. Although interfacial strength between a dense SiCOH dielectric and a diffusion barrier dielectric cap, such as SiN, SiC(H) or SiCN(H), was enhanced, this prior art technique requires an additional graded layer of dielectric films. Moreover, the aforementioned technique addresses only the weak cohesive strength of the near-interface layer first deposited on the substrate, not the weak adhesion strength as encountered on porous low-k materials.

U.S. Patent Application Publication No. 2005/0233555 A1 discloses a method of depositing an adhesion layer between a conductive metallic material and a dielectric layer for improving adhesion between a dielectric layer and a conductive metallic layer. The adhesion layer is deposited on a substrate with both conductive metallic material and a low-k dielectric material. This adhesion layer serves to enhance the adhesion between the conductive metallic layer and the dielectric layer deposited on top of the adhesion layer. This prior method is limited to surface treatment of a conductive copper surface.

U.S. Patent Application Publication No. 2005/0158999 A1 discloses a similar method for improving adhesion between a dielectric layer and a conductive metallic layer. This prior art method comprises treating the conductive Cu surface with ammonia ($NH_3$) or nitrogen ($N_2$) plasma to form copper nitride, followed by a second plasma exposure. Again, this prior art method is limited to a surface treatment of the conductive copper surface for improving adhesion between copper and a dielectric layer deposited on top of the conductive copper layer.

U.S. Patent Application Publication No. 2005/00067702 A1 discloses a method of treating a low-k organosilicate glass (SOG) with a plasma for improving adhesion between the low-k SOG layer and a hardmask layer. This prior art method comprises treating the low-k SOG layer with $H_2$ or He plasma to activate the low-k surface, followed by a deposition of hardmask layer on top of the low-k OSG dielectric layer. This prior art method is limited to surface treatment of a low-k SOG interlayer dielectric (ILD) layer.

As described in U.S. Pat. No. 6,251,770, a first undoped or fluorine-doped initial silicon oxide layer with substantially no carbon can be deposited underneath a carbon-containing OSG layer to increase the reactive ion etch selectivity. The OSG layer may also include an initial graded region starting from no carbon and increasing to a steady-state carbon level, to improve adhesion to the undoped silicon oxide layer. However adhesion improvement would only require ultra-thin layers, which would not be sufficient to alter etch selectivity. Also, to be substantially free of carbon, a separate deposition step with different chemical precursors would be required.

U.S. Pat. No. 6,570,256 discloses that a graded carbon layer can be employed within the initial region of a carbon-containing OSG layer to improve adhesion to the underlying substrate. However, this approach may not necessarily provide the requisite properties of the OSG film near the interface, in particular, adhesion and cohesive strength. If an oxide-like layer is desired within the OSG film, there is no means provided to achieve that.

It would thus be further highly desirable to provide a semiconductor device structure and a method for fabricating an insulating structure comprising a multitude of dielectric and conductive layers with improved adhesion strengths between the ILD layers and the capping layers in an interconnect structure. It would also be highly desirable to achieve these improved adhesion strengths without introducing additional chemical precursors. It would also be highly desirable to achieve the above without using additional equipment as is the case when a spin-on adhesion layer is formed. It would also be highly desirable to achieve the above without depositing a separate dielectric adhesion layer and to provide the improved adhesion using the same tool as the cap layer disposition tool.

SUMMARY OF THE INVENTION

In view of the above, the present invention provides a mechanically robust insulating structure with improved adhesion strength between a low-k dielectric layer and a dielectric-containing substrate. The term "improved adhesion strength" as used throughout this application denotes an adhesion strength (as measured by a four point bending test) of greater than 60% of the cohesive strength of the weaker of the two materials on either side of the interface. The term "low-k" denotes a dielectric material having a dielectric constant that is less than 4.0, and more particularly, a dielectric material with a dielectric constant of less than 3.7.

The dielectric-containing substrate employed in the present invention is typically, but not necessarily always, a dielectric capping layer which is located atop an interlevel or intralevel dielectric (ILD) of an interconnect structure. The dielectric capping layer may comprise an organic dielectric capping layer or an inorganic dielectric capping layer. These materials will be described in greater detail hereinbelow. Another type of dielectric-containing substrate that can be used in the present invention is an ILD layer of an interconnect structure.

In one embodiment of the present invention, a mechanically robust insulating structure is provided in which the adhesion strength between a low-k dielectric (dense, porous or a combination of both) layer and a dielectric-containing substrate is enhanced by treating the surface of the substrate with actinic radiation prior to low-k dielectric application.

Actinic radiation comprises UV light having a wavelength in the range from about 10 to about 1000 nm. Thus, the treatment with actinic radiation may include mid-UV, deep-UV, and extreme-UV. X-ray irradiation may also be used.

In another embodiment of the present invention, a mechanically robust insulating structure is provided in which the adhesion strength between the low-k dielectric (dense, porous or a combination of both) layer and a dielectric-containing substrate is enhanced by treating the surface of the dielectric-containing substrate with a plasma prior to low-k dielectric application.

The plasma treatment process, which can be performed in a reactor such as, for example, a PECVD reactor, a high-density plasma reactor, a sputtering chamber, or an ion beam chamber, includes providing a plasma from a gas selected from an inert gas, $H_2$, $O_2$, $NH_3$, $SiH_4$ and mixtures thereof onto the surface of the dielectric-containing substrate.

In yet another embodiment of the present invention, a mechanically robust insulating structure is provided in which the adhesion strength between the low-k dielectric (dense, porous or a combination of both) layer and a substrate is enhanced by treated the surface of the substrate with electron beam radiation prior to low-k dielectric application.

In still yet another embodiment of the present invention, a mechanically robust interconnect structure is provided in which the adhesion strength between the low-k dielectric (dense, porous or a combination of both) layer and a substrate is enhanced by treating the surface of the dielectric-containing substrate with a combination of actinic radiation, a plasma and/or electron beam radiation prior to low-k dielectric application.

It is again noted that the substrate employed in the present invention is typically a dielectric-containing capping layer including inorganic dielectric capping layers as well as organic dielectric capping layers. Illustratively, the dielectric capping layer comprises at least one of silicon oxide, silicon nitride, silicon oxynitride, SiC, $Si_4NH_3$, SiCH, a carbon doped oxide, a nitrogen and hydrogen doped silicon carbide SiC(N,H) and multilayers thereof. Of these types of dielectric capping layers, those including atoms of at least Si, C and H, with N and oxygen being optional, are highly preferred.

For actinic radiation and electron beam radiation treatments, the substrate can be a metallic layer. Illustratively, the metallic layer comprises at least one of a metal conductor, e.g., Cu and/or Al, and a diffusion barrier such as Ta, TaN, Ti, TiN, Ru, RuN, W, and/or WN.

In still another further embodiment, an electronic device structure incorporating layers of insulating and conductive materials as intralevel or interlevel dielectrics in a back-end-of-the-line ("BEOL") wiring structure is provided in which the adhesion between different dielectrics is enhanced by treating the surface of a dielectric-containing substrate with actinic radiation, plasma, electron beam radiation, or a combination thereof prior to low-k dielectric application. BEOL wiring structures may also be referred to herein as an interconnect structure.

In addition to the above embodiments, an electronic device structure is also provided in which the adhesion strength between a porous dielectric (SiCOH, OSG, carbon doped OSG) layer and a dielectric capping layer is at least 2.0 $J/m^2$, and preferably equal to the cohesive strength of the porous dielectric film itself (typically about 3.2 $J/m^2$ for k=2.2 material) as measured by a four point bending test calibrated such that the cohesive strength of $SiO_2$ deposited by a silane process is measured to be 10 $J/m^2$.

According to the principles of the invention, there is provided a method for fabricating a mechanically robust BEOL interconnect structure comprising low-k dielectric layers with enhanced adhesion strength to other layers of the interconnect structure including, for example, layers of SiN, SiC, SiCN, SiCH, SiCNH, $SiO_2$, TEOS, PSG or BPSG.

In one aspect of the invention, there is provided a method for fabricating a multilayered insulating structure with strong adhesion strength between the different layers comprising the steps of: treating a surface of a substrate with actinic radiation; and forming a low-k dielectric layer on the irradiated dielectric-containing substrate surface.

In another aspect of the invention, there is provided a method for fabricating a multilayered insulating structure with strong adhesion strength between the different layers comprising the steps of: treating the surface of a substrate with electron beam radiation; and then forming a low-k dielectric layer on the e-beam treated surface.

In yet another aspect of the invention, there is provided a method for fabricating a multilayered insulating structure with strong adhesion strength between the different layers comprising the steps of: treating the surface of a dielectric-containing substrate with a plasma; and then forming a low-k dielectric layer on the plasma treated surface.

In a further aspect of the invention, a combination of the above mentioned treatment steps are performed.

It is noted that in any of the embodiments mentioned above, the treating step may be performed in the same, or different, preferably the same, reactor or tool, as that used in forming the dielectric-containing substrate.

In a still further aspect of the invention, there is provided a method for fabricating a multilayered insulating structure with strong adhesion strength between the different layers comprising the steps of: introducing a multilayered structure having at least one surface comprising areas of patterned metals and areas of patterned dielectrics into a PECVD reactor; introducing precursors for deposition of a dielectric capping layer; treating a surface of the dielectric capping layer with at least one of actinic radiation, a plasma and e-beam radiation in the same chamber used for the dielectric cap layer deposition; and forming a low-k dielectric layer on said treated dielectric capping layer.

It is noted that in each of the above mentioned embodiments and aspects of the invention, the term "room temperature" denotes a temperature from about 20° C. to about 40° C.

In a different embodiment, the surface treatment of the dielectric capping layer is selected from the group of plasma exposure, actinic radiation and electron beam radiation simultaneously or in a series fashion.

The adhesion strength enhancing method can be used in the back-end-of-the-line (BEOL) structures of a CMOS (complementary metal oxide semiconductor) or DRAM (dynamic random access memory), flash memory and other electronic device to improve the adhesion between a low-k dielectric layer, and a hardmask, or a capping layer.

Advantageously, the method for improving the adhesion between the different layers of an electronic device structure described above is implemented in a back-end-of-the-line ("BEOL") wiring process.

DETAILED DESCRIPTION OF THE INVENTION

The present invention, which provides methods for fabricating mechanically robust electronic structures as well as the electronic structures that are fabricating therefrom, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a mechanically robust insulating structure with improved adhesion strength between a low-k dielectric (dense, porous or a combination of both) layer and a dielectric-containing substrate. The term "improved adhesion strength" as used throughout this application denotes an adhesion strength (as measured by a four point bending test) of greater than 60% of the cohesive strength of the weaker of the two materials on either side of the interface. The term "low-k" denotes a dielectric material having a dielectric constant that is less than 4.0, and more particularly, a dielectric material with a dielectric constant of less than 3.7.

The substrate employed in the present invention is typically, but not necessarily always, a dielectric capping layer which is located atop an ILD layer of an interconnect structure. The dielectric capping layer may comprise an organic dielectric capping layer or an inorganic dielectric capping layer. These materials will be described in greater detail hereinbelow. Another type of dielectric-containing substrate that can be used in the present invention is a dielectric material which is used as the interlevel or intralevel dielectric of an interconnect structure. For actinic radiation and electron beam radiation treatments, the substrate can be a metallic layer. Illustratively, the metallic layer comprises at least one of a metal conductor, e.g., Cu and/or Al, and a diffusion barrier such as Ta, TaN, Ti, TiN, Ru, RuN, W, and/or WN.

Although the following description is related to forming an interconnect structure including improved adhesion strength of a dielectric capping layer and a ILD material, the present invention is not limited to forming only such an electronic structure. Instead, the present invention can be used in improving the adhesion strength between a substrate and a low-k dielectric in any other type of electronic structure which includes the same. The following thus represents a preferred embodiment of the instant invention.

Figure 1:
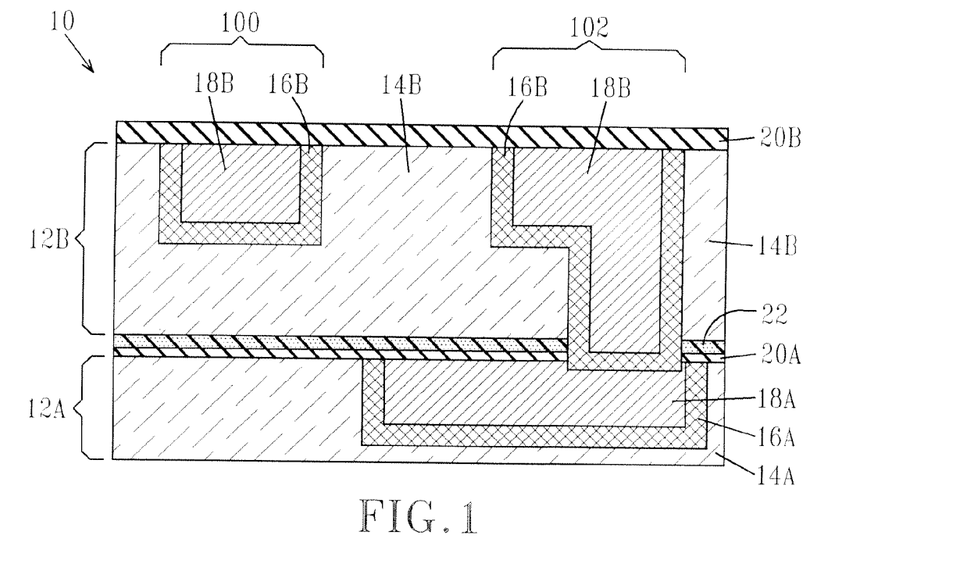
FIG. 1 is a pictorial representation (through a cross sectional view) depicting one embodiment of the present invention in which the dielectric capping layer between the two dielectric interconnect levels is surface treated in accordance with the present invention.

Reference is now made to FIG. 1 which illustrates one possible structure of the present invention. Specifically, FIG. 1 shows a multilayer interconnect 10 that includes a lower interconnect level 12A and an upper interconnect level 12B which are separated in part by a dielectric capping layer 20A which includes a treated surface layer 22 that has been formed utilizing the process of the present invention. The lower interconnect level 12A, which may or may not be present atop another element of an interconnect structure, comprises a first dielectric material 14A having at least one conductive feature embedded therein. The conductive feature includes a conductive material 18A that is separated from the first dielectric material 14A by a diffusion barrier 16A.

The upper interconnect level 12B includes a second dielectric material 14B that has at least one conductive feature embedded therein that includes conductive material 18B. The conductive material 18B is separated from the second dielectric material by diffusion barrier 16B. It is noted that in FIG. 1, the second dielectric material includes a single damascene structure 100 and a dual damascene structure 102. Although FIG. 1 illustrates such types of conductive features, the present invention also works well when a single damascene structure or a dual damascene structure is used alone. Atop the second dielectric layer 14B, there is shown a dielectric capping layer 20B, which has not, but could be, subjected to the inventive treatment process.

Figure 2:
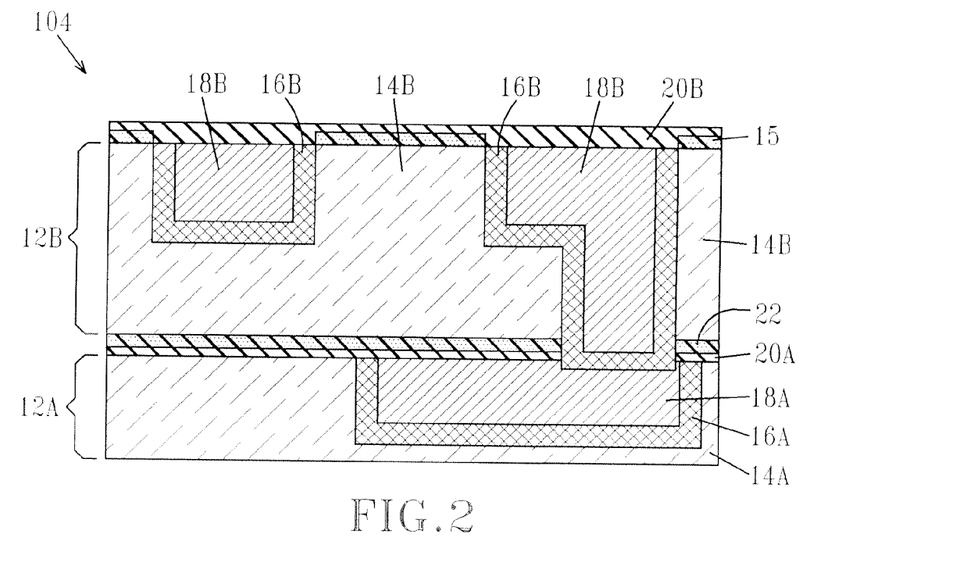
FIG. 2 is a pictorial representation (through a cross sectional view) depicting a second embodiment of the present invention in which both the dielectric capping layer and the upper interlevel dielectric (ILD) material are surface treated in accordance with the present invention.

FIG. 2 shows another electronic structure of the present invention. Specifically, the interconnect structure 104 includes basically the same elements as shown in FIG. 1 except that a surface of the second dielectric material 14B is treated in accordance with the present invention so as to form a treated surface layer 15 in an upper region of the second dielectric material 14B.

It is noted that the treated surfaces of the present invention have a rougher surface, without pitting, than untreated surfaces, which helps to increase the adhesion of the treated surface to another surface layer within the structure. Also, the treated surfaces of the present invention, are chemically different from the untreated surfaces, which also helps in forming a robust chemical bond with another layer within the structure. The combined physical and chemical differences of the treated surfaces has not, to the applicants knowledge, been heretofore mentioned in the prior art. Hence, the present invention provides a method that can be used to significantly improve the adhesion of various layers within an electronic structure.

Reference is now made to FIGS. 3-6 which illustrate the basic processing steps that are employed in the present invention for fabricating the structure shown in FIG. 1. It is noted that these same processing steps can also be used in forming the structure shown in FIG. 2 except that the second dielectric material 14B would be subjected to the surface treatment step of the present invention.

Figure 3:
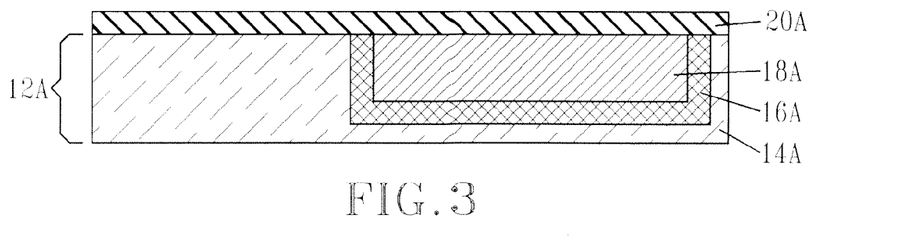
FIGS. 3-6 are pictorial representations (through cross sectional views) depicting the basic processing steps employed in the present invention in fabricating the structure shown in FIG. 1.

FIG. 3 shows an initial interconnect structure that includes a lower interconnect level 12A having a dielectric capping layer 20A located on a surface thereof. The lower interconnect level 12A includes the first dielectric material 14A having at least one conductive feature embedded therein which includes conductive material 18A. A diffusion barrier 16A separates the conductive material 18A from the first dielectric material 14A.

The initial interconnect structure shown in FIG. 3 is fabricated utilizing standard interconnect processing which is well known in the art. For example, the lower interconnect level 12A is formed by applying the first dielectric material 14A to another element of an electronic structure (not shown). This other element, which is not shown, may comprise a semiconducting material, an insulating material, a conductive material or any combination thereof. When the other element is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor element is a layered semiconductor such as, for example, Si/SiGe, Si/SiC, silicon-on-insulators (SOIs) or silicon germanium-on-insulators (SGOIs).

When the other element of the electronic structure is an insulating material, the insulating material can be an organic insulator, an inorganic insulator or a combination thereof including multilayers. When the other element of the electronic structure is a conducting material, the other element may include, for example, polySi, an elemental metal, alloys of elemental metals, a metal silicide, a metal nitride or combinations thereof including multilayers. When the other element comprises a semiconducting material, one or more semiconductor devices such as, for example, complementary metal oxide semiconductor (CMOS) devices can be fabricated thereon.

The first dielectric material 14A of the lower interconnect level 12A may comprise any interlevel or intralevel dielectric including inorganic dielectrics or organic dielectrics. The first dielectric material 14A may be porous, non-porous or a combination thereof. Some examples of suitable dielectrics that can be used as the first dielectric material 14A include, but are not limited to: silicon oxide, silicon nitride, silicon oxynitride, a silsesquioxane, a C doped oxide (i.e., organosilicates) that include atoms of Si, C, O and H, thermosetting polyarylene ethers, SiC, SiCH, SiCN, SiCHN, tetraethylorthosilicate ("TEOS"), phosphorus silicate glass ("PSG"), boron phosphorus silicate glass ("BPSG") or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 14A typically has a dielectric constant that is about 4.0 or less, with a dielectric constant of about 2.8 or less being even more typical. All dielectric constants mentioned herein are relative dielectric constants to that of a vacuum. These dielectrics generally have a lower parasitic cross talk as compared with dielectric materials that have a higher dielectric constant than 4.0. The thickness of the first dielectric material 14A may vary depending upon the dielectric material used as well as the exact number of dielectrics within the lower interconnect level 12A. Typically, and for normal interconnect structures, the first dielectric material 14A has a thickness from about 100 to about 450 nm.

The first dielectric material 14A is formed utilizing a conventional deposition process such as, for example, chemical vapor deposition (CVD), PECVD, evaporation or spin-on coating. A curing process, which is well known to those skilled in the art, can also be used in some embodiments in forming the first dielectric material. Typically, the first dielectric material is formed by PECVD or spin-on coating.

The lower interconnect level 12A also has at least one conductive feature that is embedded in (i.e., located within) the first dielectric material 14A. The conductive feature comprises a conductive material 18A that is separated from the first dielectric material 14A by a diffusion barrier 16A. The conductive feature is formed by lithography (i.e., applying a photoresist to the surface of the first dielectric material 14A, exposing the photoresist to a desired pattern of radiation, and developing the exposed resist utilizing a conventional resist developer), etching (dry etching or wet etching) an opening in the first dielectric material 14A and filling the etched region with the diffusion barrier 16A and then with a conducive material 18A forming the conductive feature.

The diffusion barrier 16A, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), sputtering, chemical solution deposition, or plating.

Following the formation of the diffusion barrier 16A, the remaining region of the opening within the first dielectric material 14A is filled with a conductive material 18A forming the conductive feature. The conductive material 18A used in forming the conductive feature includes, for example, polySi, a conductive metal, an alloy comprising at least one conductive metal, a conductive metal silicide or combinations thereof. Preferably, the conductive material 18A that is used in forming the conductive feature is a conductive metal such as Cu, W or Al, with Cu or a Cu alloy (such as AlCu) being highly preferred in the present invention.

The conductive material 18A is filled into the remaining opening in the first dielectric material 14A utilizing a conventional deposition process including, but not limited to: CVD, PECVD, sputtering, chemical solution deposition or plating. After deposition, a conventional planarization process such as chemical mechanical polishing (CMP) can be used to provide a structure in which the barrier layer 16A and the conductive material 18A each have an upper surface that is substantially coplanar with the upper surface of the first dielectric material 14A.

After forming the at least one conductive feature, a dielectric capping layer 20A is formed on the surface of the lower interconnect level 12A utilizing a conventional deposition process such as, for example, CVD, PECVD, chemical solution deposition, or evaporation. The dielectric capping layer 20A comprises any suitable dielectric capping material whose chemical composition is different from the first dielectric material 14A. Illustratively, the dielectric capping layer 20A includes silicon oxide, silicon nitride, silicon oxynitride, SiC, $Si_4NH_3$, SiCH, a carbon doped oxide, a nitrogen and hydrogen doped silicon carbide SiC(N,H) or multilayers thereof. The thickness of the dielectric capping layer 20A may vary depending on the technique used to form the same as well as the material make-up of the layer. Typically, the dielectric capping layer 20A has a thickness from about 15 to about 55 nm, with a thickness from about 25 to about 45 nm being more typical.

Figure 4:
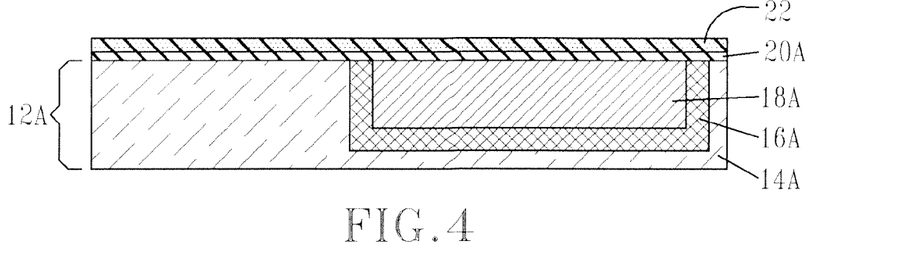

FIG. 4 shows the structure of FIG. 3 after the dielectric capping layer 20A has been surface treated in accordance with the present invention which forms treated surface layer 22 within an upper region of the originally deposited dielectric capping layer 20A.

As stated above, the treated surface layer 22 has a rougher surface, without pitting, than the untreated surface, which helps to increase the adhesion of that layer to another layer within the structure. Also, the treated surface layer 22 of the present invention, is chemically different from the untreated surface, which also helps in forming a chemical bond with another layer within the structure. The treated surface layer 22 is formed within an upper region of the previously deposited dielectric capping layer 20A. It is noted that the thickness, i.e., depth, of the treated surface layer 22 that is formed is dependent on the conditions used in the surface treatment processing step of the present invention.

The treated surface layer 22 is formed by contacting the surface of the previously deposited dielectric capping layer 20A with at least one of a plasma, actinic radiation and electron beam radiation.

When actinic irradiation is employed in the present invention, the actinic treatment is performed preferably, but not necessarily always, in the same tool as that used in depositing the dielectric capping layer 20A. The actinic radiation includes, but not limited to, UV light having a wavelength in the range from about 10 nm to about 1000 nm, and X-ray radiation. The following conditions may be employed for this aspect of the present invention: a radiation time from about 10 sec to about 30 min, a temperature from room temp to about 500° C., and an environment including vacuum, or gases such as inert gas, $N_2$, $H_2$, $O_2$, $NH_3$, hydrocarbon, $SiH_4$, etc.

When electron beam treatment is used, the following conditions are typically employed: an electron beam energy from about 0.1 to about 10,000 eV, a radiation time of about 10 sec to about 30 min and a temperature from room temperature to about 500° C. This treatment step may or may not be performed in the same tool as that used in forming the dielectric capping layer 20A.

When plasma treatment is used, the plasma used in the treatment step can be inert (Ar, He), $N_2$, $H_2$, $O_2$, $NH_3$, hydrocarbon, or $SiH_4$. A plasma treatment time from about 2 sec to about 10 min and a plasma treatment temperature from room temperature to about 400° C. can be employed. This treatment step may or may not be performed in the same tool as that used in forming the dielectric capping layer 20A.

Next, the upper interconnect level 12B is formed by applying the second dielectric material 14B to the upper exposed treated surface layer 22 of the dielectric capping layer 20A. The second dielectric material 14B may comprise the same or different, preferably the same, low k dielectric material as that of the first dielectric material 14A of the lower interconnect level 12A. It is noted that the second dielectric typically has a different chemical composition relative to the dielectric capping layer 20A. The processing techniques and thickness ranges for the first dielectric material 14A are also applicable here for the second dielectric material 14B. Next, at least one opening is formed into the second dielectric material 14B utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation.

Figure 5:
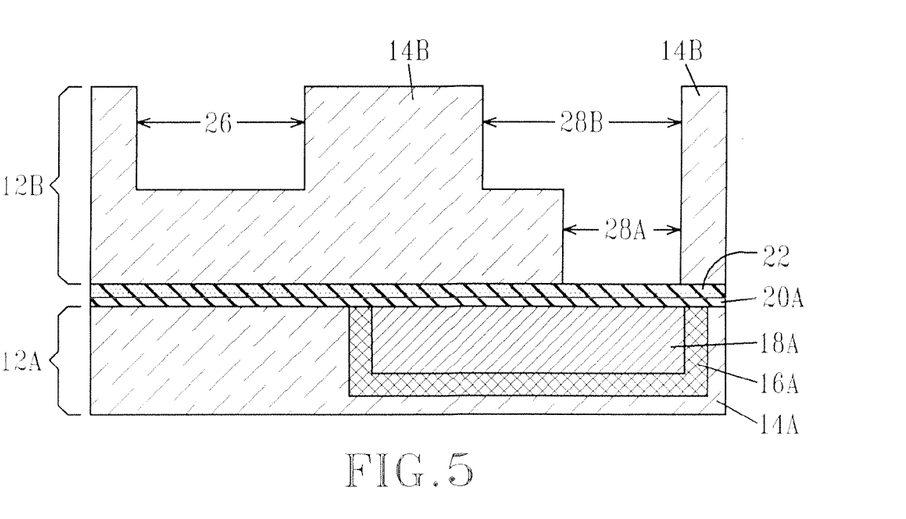

In FIG. 5, two openings are shown; reference number 26 denotes a line opening for a single damascene structure, and reference numerals 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, an etching step is used to remove a portion of the dielectric capping layer 20A including the treated surface layer 22 that is located atop the conductive material 18A that is embedded within the first dielectric material 14A. This step of the present invention is shown, for example, in FIG. 6.

Figure 6:
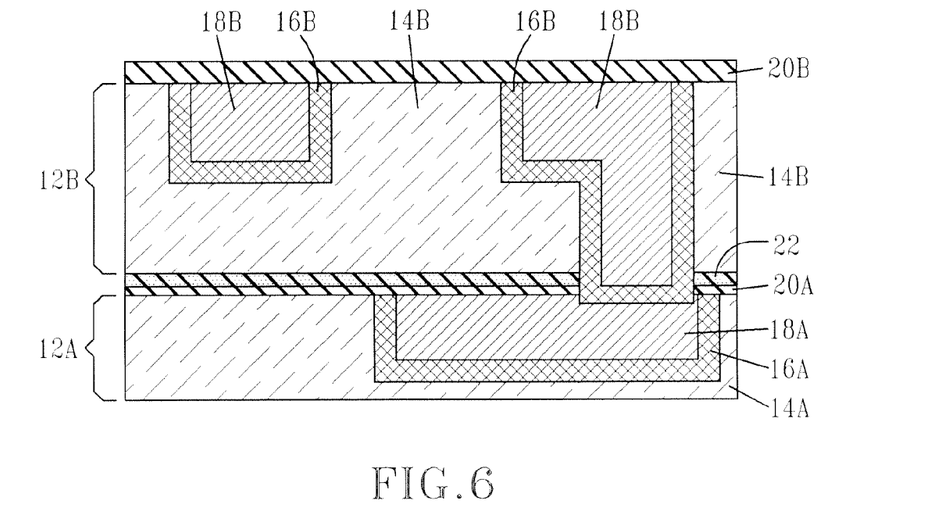

FIG. 6 also shows the structure after forming a diffusion barrier 16B and a conductive material 18B within each of the openings provided in the second dielectric material 14B. The diffusion barrier 16B, which comprises the same or different materials as that of diffusion barrier 16A, is formed utilizing one of techniques mentioned above in forming the diffusion barrier 16A in the first dielectric material 14A. The conductive material 18B can include the same or different material as that defined above for conductive material 18A and one of the techniques used above in forming the conductive material 18A in the first conductive material 14A can also be used here as well. A filling each of the openings with the conductive material 18B, a conventional planarization process such as chemical mechanical polishing (CMP) and/or grinding can be used.

Although not shown in these drawings, the upper surface of the second dielectric material 14B can be subjected to one of the above mentioned surface treatment techniques to form a treated surface layer within the second dielectric material 14B that has improved adhesion properties. Such a structure is shown in FIG. 2.

Notwithstanding whether the second dielectric material 14B has been subjected to such treatment or not, a dielectric capping layer 20B is formed on the structure such as such in FIG. 6. The dielectric capping layer 20B is comprised of the same or different material as that of dielectric capping layer 20A. It is further noted that the structure shown in FIG. 6 represents a close-via bottom structure.

In another embodiment of the present invention, an open-via bottom structure can be provided. In the open-via bottom structure, the conductive material 18B is in direct contact with a surface of the at least one conductive feature present in the first dielectric material 14A. The open-via bottom structure is formed by removing the diffusion barrier 16B from the bottom of via 28A utilizing ion bombardment or another like directional etching process. The present invention also contemplates an anchored-via bottom structure. The anchored-via bottom structure is formed by first etching a recess into the conductive feature in the first dielectric material 14A utilizing a selective etching process. After formation of the diffusion barrier 16B, the diffusion barrier 16B is typically removed from the bottom portion of the via and recess by a directional etching process. The conductive material 18B is then formed as described above.

It is noted that the treated surface layers of the present invention have a debonding strength that is greater than that of the untreated material. For example, the debonding strength of a porous SiCOH dielectric (as either the capping layer or the ILD) can be improved from 2.6 $J/m^2$ to a value that is within the range from about 3.2 to about 3.4 $J/m^2$. In such also be noted that the surface treatment step is typically, but not necessarily always, performed in the same tool as that which was used in depositing the dielectric material. Hence, in such a circumstance, the structure is not exposed to air. The inventive structure and method eliminate the need for using a separate adhesion layer which, if present, may affect device performance by increasing the overall dielectric constant of the structure.

The following examples are provided to illustrate some aspects of the present invention and to demonstrate the improved adhesion strength that can be achieved utilizing the processing steps described above.

EXAMPLE 1

Conventional; Not of the Invention

In this control example, a wafer containing an electronic structure having an upper layer of first dielectric with metal structures embedded in it was inserted in a plasma enhanced chemical vapor deposition ("PECVD") reactor. The wafer was then heated to a temperature between room temperature and 350° C. In one example, Ar was flown into a 8" the reactor at a rate of 30 sccm to achieve a pressure of 100 mTorr. A high frequency RF power source connected to the substrate holder was then turned on to about 60.0 W for 0.5 to 2 minutes. In a different example, the RF power generated was operated under bias control at a bias of −250 VDC. Without interrupting the plasma, the precursor mixture used for the deposition of the next dielectric film i.e., a SiCNH capping layer, was then flown into the reactor keeping the power and pressure unchanged until the flow was stabilized an then for an additional 5-15 seconds. The Ar flow was then shut off and the plasma conditions were adjusted for the deposition of the dielectric.

After the deposition of the SiCNH dielectric capping layer, a porous SiCOH dielectric having a dielectric constant of about 2.3 was applied on the dielectric capping layer by spin coating. The wafer was UV cured at 400° C. under $N_2$ for 5 min. This achieved a 4 point bending adhesion strength of 2.5±0.15 $J/m^2$ between the porous SiCOH and the SiCNH capping layer.

EXAMPLE 2

$NH_3$ Plasma

In this inventive example, a wafer containing an electronic structure having an upper layer of first dielectric with metal structures embedded in it was inserted in a plasma enhanced chemical vapor deposition ("PECVD") reactor. The wafer was then heated to a temperature between room temperature and 350° C. In one example, Ar was flown into a 8" the reactor at a rate of 30 sccm to achieve a pressure of 100 mTorr. A high frequency RF power source connected to the substrate holder was then turned on to about 60.0 W for 0.5 to 2 minutes. In a different example, the RF power generated was operated under bias control at a bias of −250 VDC. Without interrupting the plasma, the precursor mixture used for the deposition of the next dielectric film (i.e., a SiCNH dielectric capping layer) was then flown into the reactor keeping the power and pressure unchanged until the flow was stabilized an then for an additional 5-15 seconds. The Ar flow was then shut off and the plasma conditions were adjusted for the deposition of the dielectric.

The precursor flow was turned off. The dielectric capping layer was thereafter treated was $NH_3$ plasma for 10 sec. After the surface treatment, a porous SiCOH dielectric (k of about 3.2) was applied on the surface treated capping layer by spin coating. The wafer was UV cured at 400° C. under $N_2$ for 5 min. This achieved a 4 point bending adhesion strength of 3.45±0.15 $J/m^2$ between the porous SiCOH and SiCNH capping layer.

EXAMPLE 3

He Plasma

In this inventive example, a wafer containing an electronic structure having an upper layer of first dielectric with metal structures embedded in it was inserted in a plasma enhanced chemical vapor deposition ("PECVD") reactor. The wafer was then heated to a temperature between room temperature and 350° C. In one example, Ar was flown into a 8" the reactor at a rate of 30 sccm to achieve a pressure of 100 mTorr. A high frequency RF power source connected to the substrate holder was then turned on to about 60.0 W for 0.5 to 2 minutes. In a different example, the RF power generated was operated under bias control at a bias of −250 VDC. Without interrupting the plasma, the precursor mixture used for the deposition of the next dielectric film (i.e., a SiCNH dielectric capping layer) was then flown into the reactor keeping the power and pressure unchanged until the flow was stabilized an then for an additional 5-15 seconds. The Ar flow was then shut off and the plasma conditions were adjusted for the deposition of the dielectric. The precursor flow was turned off.

The SiCNH dielectric capping layer was treated was He plasma for 10 sec. After the surface treatment, a porous SiCOH dielectric (k of about 3.2) was applied on the surface treated capping layer by spin coating. The wafer was UV cured at 400° C. under $N_2$ for 5 min. This achieved a 4 point bending adhesion strength of 3.2±0.1 $J/m^2$ between the porous SiCOH and SiCNH cap substrate layer.

In these examples, AFM, Augur, and contact angle measurement data confirm a modification of the surface of the dielectric capping layer with increased hydrophilicity, surface roughness and/or O enrichment. By contrast a control sample with poor interfacial strength shows hydrophobic surface, and had an O poor surface.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for improving the adhesion strength between two different layers comprising:
   forming a blanket layer of a dielectric capping material directly on an uppermost surface of an interconnect dielectric material and directly on an uppermost surface of at least one conductive feature embedded in said interconnect dielectric material;
   treating an upper region of said blanket layer of dielectric capping material with at least one of actinic radiation and electron beam (e-beam) radiation to form a treated surface layer within said upper region of said blanket layer of dielectric capping material, said treated surface layer is located upon an untreated portion of said blanket layer of dielectric capping material, and is physically and chemically different from said untreated portion of said blanket layer of dielectric capping material, and said untreated portion of said blanket layer of dielectric capping material separates the treated surface layer within said upper region of said blanket layer of dielectric capping material from both said interconnect dielectric material and said at least one conductive feature; and
   forming a low-k dielectric layer having a dielectric constant of less than 4.0 on said treated surface layer, wherein said treated surface layer remains as a permanent element in a semiconductor structure and is located between a remaining portion of the blanket layer of dielectric capping material and said low-k dielectric layer.

2. The method in claim 1 where said treating comprises actinic radiation, said actinic radiation includes a UV light of a wavelength in a range from about 10 to about 1000 nm, or X-ray radiation.

3. The method of claim 1 wherein said treating comprises e-beam radiation, said e-beam radiation is performed at an electron beam energy from about 0.1 to about 10,000 eV, a radiation time of about 10 sec to about 30 min and a temperature from room temperature to about 500° C.

4. The method of claim 1 wherein said blanket layer of dielectric capping material has a different composition than said low-k dielectric layer.

5. The method of claim 4 wherein said blanket layer of dielectric capping material is selected from the group consisting of silicon oxide, silicon nitride, silicon oxynitride, SiC, $Si_4NH_3$, SiCH, a carbon doped oxide, a nitrogen and hydrogen doped silicon carbide SiC(N,H) and multilayers thereof.

6. The method of claim 1 wherein said low-k dielectric layer is selected from the group consisting of a silsesquioxane, a C doped oxide that includes atoms of Si, C, O and H, thermosetting polyarylene ethers, SiC, SiCH, SiCN, SiCHN, and multilayers thereof.

7. The method of claim 1 wherein said blanket layer of dielectric capping material is formed by PECVD or spin-coating.

8. The method of claim 1 wherein said forming said low-k dielectric layer comprises a deposition step followed by a curing step.

9. The method of claim 1 wherein said treating further comprises plasma treatment in conjunction with one of said actinic radiation and electron beam radiation.

10. The method of claim 1 wherein only actinic radiation is employed in said treating the upper region of the blanket layer of dielectric capping material.

11. The method of claim 1 wherein only electron beam radiation is employed in said treating the upper region of the blanket layer of dielectric capping material.

12. The method of claim 1 wherein a combination of both actinic radiation and electron beam radiation is employed in said treating the upper region of the blanket layer of dielectric capping material.

13. The method of claim 1 wherein said blanket layer of dielectric capping material spans an entirety of an interconnect level containing said interconnect dielectric material and said at least one conductive feature.

14. A method of forming an interconnect structure comprising:
   providing an interconnect level having at least one conductive feature embedded within a dielectric material;
   forming a dielectric capping layer on an uppermost surface of both said dielectric material and said at least one conductive feature of said interconnect level; and
   treating an upper region of the dielectric capping layer with at least one of actinic radiation and electron beam (e-beam) radiation to form a treated surface layer within said upper region of the dielectric capping layer, said treated surface layer is located upon an untreated portion of said dielectric capping layer, and is physically and chemically different from said untreated portion of said dielectric capping layer, wherein said treated surface layer remains as a permanent element in said interconnect structure and is located between a remaining portion of said dielectric capping layer and both said dielectric material and said at least one conductive feature of said interconnect level.

15. The method in claim 14 where said treating comprises actinic radiation, said actinic radiation includes a UV light of a wavelength in a range from about 10 to about 1000 nm, or X-ray radiation.

16. The method of claim 14 wherein said treating comprises e-beam radiation, said e-beam radiation is performed at an electron beam energy from about 0.1 to about 10,000 eV, a radiation time of about 10 sec to about 30 min and a temperature from room temperature to about 500° C.

17. The method of claim 14 wherein said treating further comprises plasma treatment in conjunction with one of said actinic radiation and electron beam radiation.

18. The method of claim 14 wherein only actinic radiation is employed in said treating the upper region of the dielectric capping layer.

19. The method of claim 14 wherein only electron beam radiation is employed in said treating the upper region of the dielectric capping layer.

20. The method of claim 14 wherein a combination of both actinic radiation and electron beam radiation is employed in said treating the upper region of the dielectric capping layer.

* * * * *